United States Patent [19]
Kishimoto

[11] Patent Number: 5,691,243
[45] Date of Patent: Nov. 25, 1997

[54] PROCESS FOR MANUFACTURING COMPOSITE SEMICONDUCTOR DEVICE

[75] Inventor: Kazunori Kishimoto, Tokyo, Japan

[73] Assignee: NEC Corporation, Tokyo, Japan

[21] Appl. No.: 647,725

[22] Filed: May 15, 1996

[30] Foreign Application Priority Data

May 15, 1996 [JP] Japan .................................. 7-139892

[51] Int. Cl.$^6$ .................................................. H01L 21/60
[52] U.S. Cl. ........................... 437/209; 437/208; 437/915
[58] Field of Search ..................................... 437/208, 209, 437/915

[56] References Cited

U.S. PATENT DOCUMENTS

| | | |
|---|---|---|
| 3,660,726 | 5/1972 | Ammon et al. . |
| 4,953,005 | 8/1990 | Carlson et al. . |
| 5,137,836 | 8/1992 | Lam ................................ 437/915 |
| 5,403,784 | 4/1995 | Hashemi et al. .................. 437/915 |
| 5,552,963 | 9/1996 | Burns ............................... 437/915 |
| 5,587,341 | 12/1996 | Masayuki et al. ................ 437/208 |

FOREIGN PATENT DOCUMENTS

| | | |
|---|---|---|
| 62-85457 | 4/1987 | Japan . |
| 2-32542 | 2/1990 | Japan ................................ 437/208 |

*Primary Examiner*—John Niebling
*Assistant Examiner*—Kevin F. Turner
*Attorney, Agent, or Firm*—Foley & Lardner

[57] ABSTRACT

A composite semiconductor device having a plurality of semiconductor chips (12, 13), a package (11) receiving the semiconductor chips (12, 13) and leads (14, 14', 15, 15') which are connected to electrode pads (17, 19) of the semiconductor chips (12, 13) and extend outside the package (11) is manufactured by a process comprising a first step for electrically connecting the electrode pads (17, 19) to the inner portion of the leads (14, 14', 15, 15') and packaging the semiconductor chips (12, 13) and the inner portion of the lead (14, 14', 15, 15') within the package (11), and a second step for connecting the lead (14') connected to the electrode pad (17) of the semiconductor chip (12) to the lead (15') connected to the electrode pad (19) of the semiconductor chip (13) by means of a solder (20) to form a composite lead (22). The second step is carried out if all of the semiconductor chips (12, 13) are proved to have a good quality in an inspection step carried out after the first step. In the inspection step, an input/output test for the outer portion of the lead (14, 14', 15, 15') extending outside the package (11) is conducted.

6 Claims, 4 Drawing Sheets

PROCESS FOR MANUFACTURING COMPOSITE SEMICONDUCTOR DEVICE

FIELD OF THE INVENTION

The present invention relates to a process for manufacturing a composite semiconductor device having a plurality of semiconductor chips therein each provided with an integrated circuit.

BACKGROUND OF THE INVENTION

Generally, a semiconductor device has one semiconductor chip in a package. With such a semiconductor device, if a plurality of semiconductor chips are necessary for manufacturing an electronic device for providing desired functions, a plurality of semiconductor devices must be used in the same number as the necessary semiconductor chips and therefore, a large circuit board is required for mounting the semiconductor devices with the result that the small size of the electronic device is hardly to be realized.

Consequently, when employing a plurality of semiconductor chips, there is often used a composite semiconductor device having a plurality of semiconductor chips in a package in order to satisfy the requirement of small size of the electronic device.

FIG. 1 is a schematic view for showing an example of the conventional composite semiconductor device. In a package 51, two semiconductor chips 52 and 53 are provided. The semiconductor chips 52 and 53 have input/output electrode pads 57 and 59 for the integrated circuit formed in the chips, respectively. In package 51, two electrcally conductive land portions 60 are disposed between the semiconductor chips 52 and 53. Two of the electrode pads 57 on the semiconductor chip 52 are connected to the land portions 60 via bonding wires 56, and two of the electrode pads 59 on the semiconductor chip 53 are connected to the land portions 60 via bonding wires 58. The others of the electrode pads 57 on the semiconductor chip 52 are connected to leads 54 via bonding wires 56, and the others of the electrode pads 59 on the semiconductor chip 53 are connected to the leads 59 via bonding wires 58.

The process for manufacturing such a semiconductor device includes an inspection step for examining the quality of the device. Only the device which has demonstrated good quality in the inspection step is placed on sale. In the process for manufacturing the semiconductor device having one semiconductor chip in the package, as shown in FIG. 2, since all the electrode pads 57 of the semiconductor chips 52 are connected to the leads 54 via the bonding wires 56, the inspection step can be carried out by connecting the terminals t of an inspection apparatus T referred to as the semiconductor tester to all the leads 54 at the outside of the package 51 followed by testing the input/output through all the leads 54 with the result that the quality of the device can be exactly examined.

However, in the above-mentioned conventional composite semiconductor device, since the inspection apparatus T positioned at the outside of the package 51 cannot be connected to the electrode pads 57 and 59 of the semiconductor chips 52 and 53 the input/output cannot be tested for the electrode pads 57 and 59.

Accordingly, the method of inspection which has already been established and carried out for the individual semiconductor chips 52 and 53 cannot be employed for the above-mentioned composite semiconductor device and, a new method or system or program must be established in which the quality of the device is examined by testing the input/output only for the electrode pads 57 and 59 connected to the leads 54 and 55. This is complicated.

In other words, when designing a new composite semiconductor device having a plurality of semiconductor chips in order to make the size of the device small, it cannot be avoided that new inspection method must be designed which differs from the method already established for semiconductor device having individual chip. Therefore, the design of the above-mentioned conventional composite semiconductor device is accompanied by the design of the new inspection method resulting in an increase of the costs.

FIG. 3 is a schematic cross-sectional view for showing another example of conventional pin grid array type composite semiconductor device which is disclosed in Japanese Patent Application Laid-open No. 62-85457. A semiconductor chip 73 is mounted on a package 71, and a semiconductor chip 74 is mounted on a package 72. The packages 71 and 72 are adhered to each other. The electrode pad on the semiconductor chip 73 is connected to a pin 79 via a bonding wire 77, and the electrode pad on the semiconductor chip 74 is connected to a pin 76 via a bonding wire 78.

In this type composite semiconductor device, the semiconductor chips 73 and 74 can be examined independently because the input/output can be tested for all electrode pads of each of the semiconductor chips 73 and 74. However, the pin grid array is complicated in structure and high in price and, connecting the device to the circuit board requires a complicated mounting process and requires a complicated wiring pattern of the circuit board.

SUMMARY OF THE INVENTION

Accordingly, an object of the present invention is to provide a process for manufacturing a composite semiconductor device which will not require a complicated wiring pattern of the circuit board on which the composite semiconductor device is mounted, and which may be tested using an inspection method already established for the individual semiconductor chip.

According to the present invention, there is provided a process for manufacturing a composite semiconductor device having a plurality of semiconductor chips, a package receiving the semiconductor chips and a lead which is connected to an electrode of the semiconductor chips and extends outside the package, comprising:

a first step for electrically connecting the electrode to an inner portion of the lead and packaging the semiconductor chips and the inner portion of the lead within the package; and a second step for connecting the lead connected to the electrode of one of the semiconductor chips to the lead connected to the electrode of another of the semiconductor chips by means of an electrically conductive member to form a composite lead.

An aspect of the present invention comprises an inspection step for examining the quality of each of the semiconductor chips by conducting an input/output test using an outer portion of the lead extending outside the package after the first step and prior to the second step.

In an aspect of the present invention, the second step is carried out if all of the semiconductor chips are proved to have a good quality in the inspection step.

In an aspect of the present invention, the lead connected to the electrode of one of the semiconductor chips and the lead connected to the electrode of another of the semiconductor chips to be interconnected to each other extend adjacently in parallel to each other outside the package.

According to the present invention, there is also provided a process for manufacturing a composite semiconductor device having a plurality of semiconductor chips, a package receiving the semiconductor chips and a lead which is connected to an electrode of the semiconductor chips and extends outside the package, comprising:

a first step for providing a divided lead having two divided portions;

a second step for electrically connecting the electrode to an inner portion of the lead and the divided lead and packaging the semiconductor chips and the inner portion of the lead and the divided lead within the package, wherein one of the divided portions of the divided lead is connected to the electrode of one of the semiconductor chips, and the other of the divided portions of the divided lead is connected to the electrode of another of the semiconductor chips, the divided portions being made individually extending outside the package; and a third step for connecting the two divided portions outside the package by means of an electrically conductive member.

An aspect of the present invention comprises an inspection step for examining the quality of each of the semiconductor chips by conducting an input/output test for an outer portion of the lead and the divided lead extending outside the package after the second step and prior to the third step.

In an aspect of the present invention, the third step is carried out if all of the semiconductor chips are proved to have a good quality in the inspection step.

In an aspect of the present invention, the package is made of plastic material.

In an aspect of the present invention, the electrically conductive member is made of solder.

According to the present invention, since a composite lead is used as a signal line for directly connecting a plurality of semiconductor chips in the composite semiconductor device, all the input/output can be tested for each semiconductor chip in the inspection step carried out prior to the connection of the portions of the composite lead, and an inspection method already established for each semiconductor chip can be used as such.

Therefore, if a new composite semiconductor device is designed, which includes a plurality of semiconductor chips which have been used individually in the past, it is unnecessary to establish a new inspection method for examining each semiconductor chip, that is, the costs for design can be made lower.

When the composite semiconductor device obtained by the process according to the present invention is mounted on a printed circuit board, it is unnecessary to make an electrical connection between the semiconductor chips by means of a wiring pattern of the circuit board and so the wiring pattern formed on the circuit board can be made simple.

Furthermore, since the lead used in the process according to the present invention can be easily formed from a leadframe which is prepared in the same manner as the conventional leadframe, the costs of the lead can be substantially equal to the conventional one and therefore, the costs for manufacturing the composite semiconductor device is not increased.

DESCRIPTION OF THE PREFERRED EMBODIMENTS

Now, several specific embodiments of the present invention are explained with reference to the accompanying drawings.

FIGS. 4, 5, 6, 7A and 7B are respectively schematic views for explaining a first embodiment of process for manufacturing composite semiconductor device according to the present invention.

Figure 4:
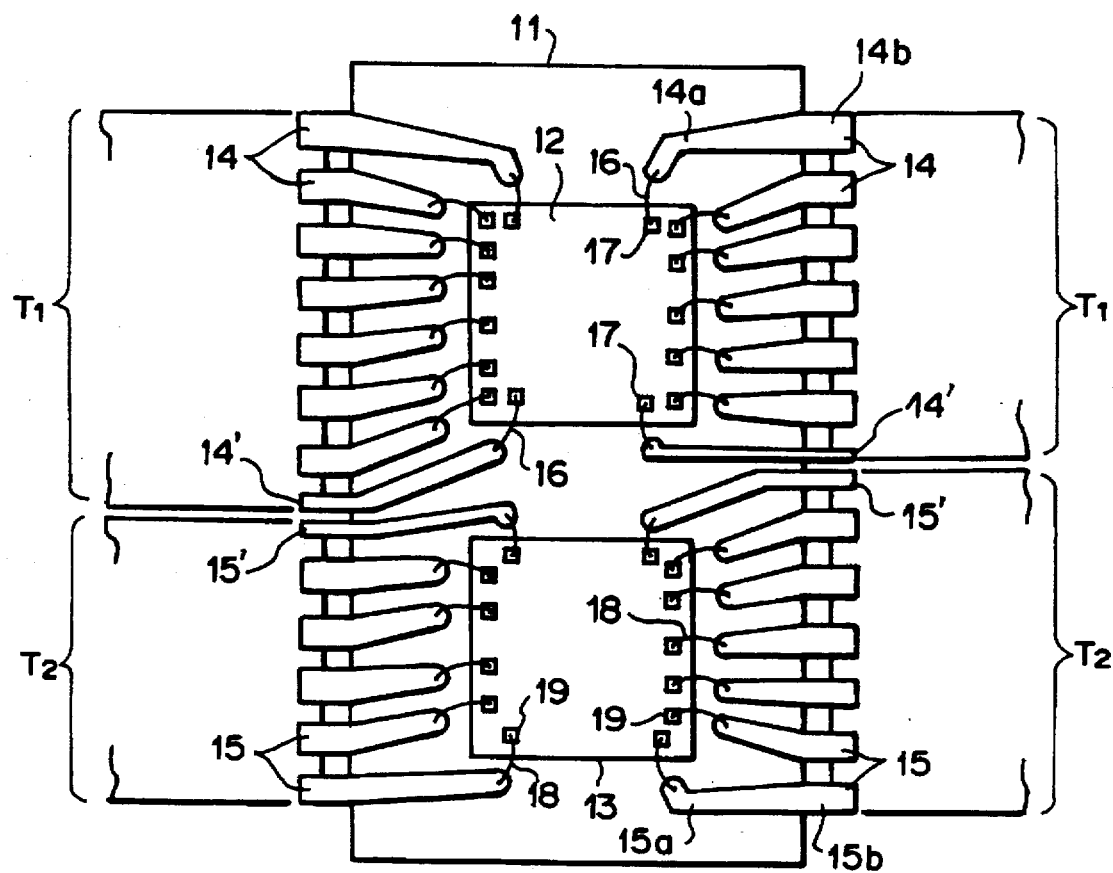
FIGS. 4, 5, 6, 7A and 7B are respective schematic views illustrating a first embodiment of a process for manufacturing a composite semiconductor device according to the present invention.
Figure 5:
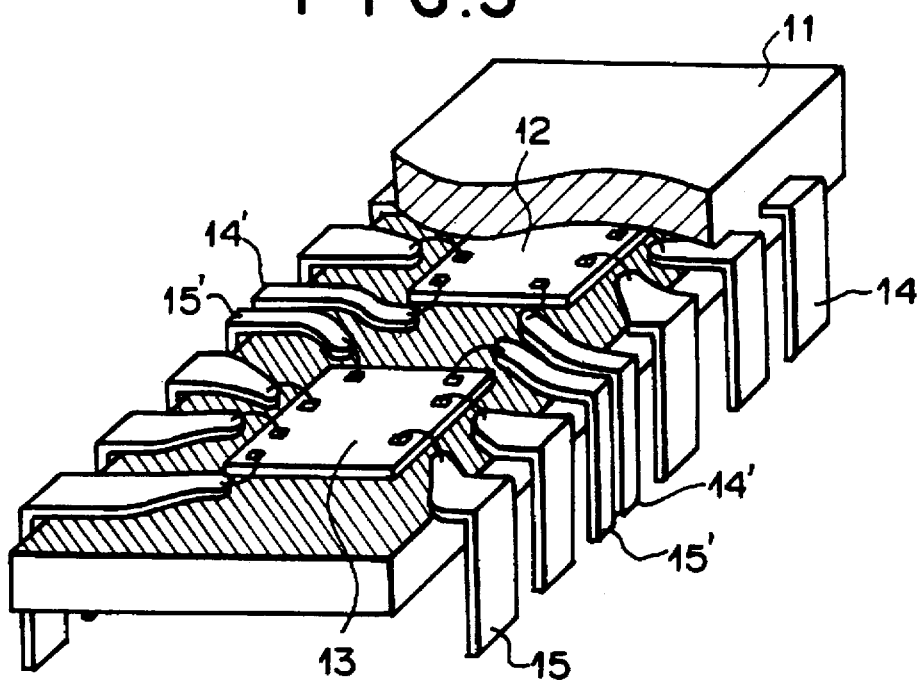

As shown in FIGS. 4 and 5, in a package 11, two semiconductor chips 12 and 13 are contained. The semiconductor chips 12 and 13 each have an integrated circuit therein, and have electrode pads 17 and 19 on the upper surface thereof, respectively, for providing the input/output for the integrated circuit. The package 11 is, for example, made of plastic material. The electrode pads 17 of the semiconductor chip 12 are connected to metal leads 14 and 14' via metal bonding wires 16, and the electrode pads 19 of the semiconductor chip 13 are connected to metal leads 15 and 15' via metal bonding wires 18. Each lead 14, 15 comprises an inner portion 14a, 15a positioned within the package 11 and an outer portion 14b, 15b positioned without the package 11. This is also the case for each lead 14', 15'.

The leads 14' and 15' are positioned adjacent to each other to form a pair of leads. Outside the package 11, the leads 14' and 15' extend in parallel to form a gap therebetween. The leads 14' and 15' are narrower than the other leads 14 and 15 and, outside the package 11, have substantially the same thickness as each lead 14, 15. That is, leads 14' and 15' together occupy the space of a single conventional lead.

Figure 1:
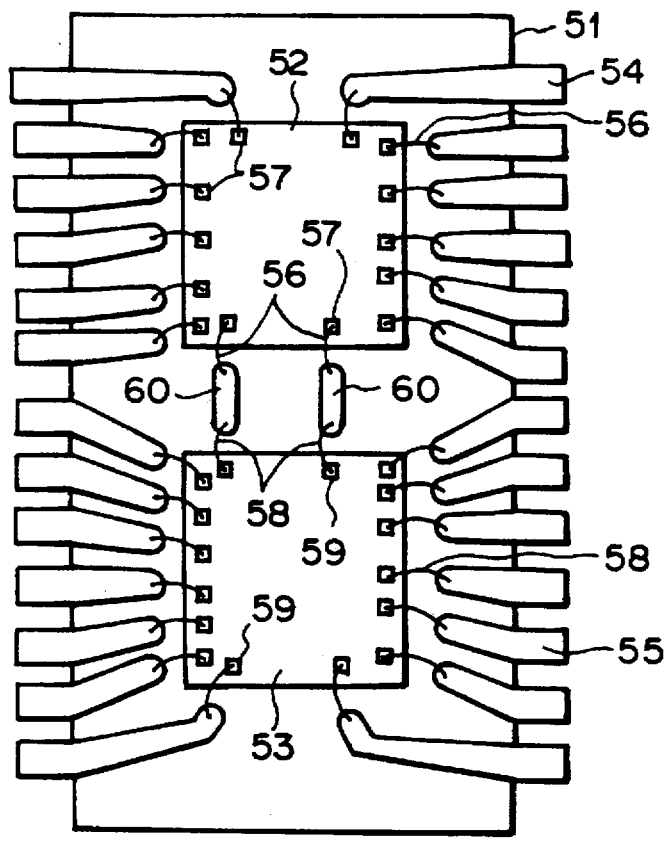
FIG. 1 is a schematic view showing an example of a conventional composite semiconductor device.
Figure 2:
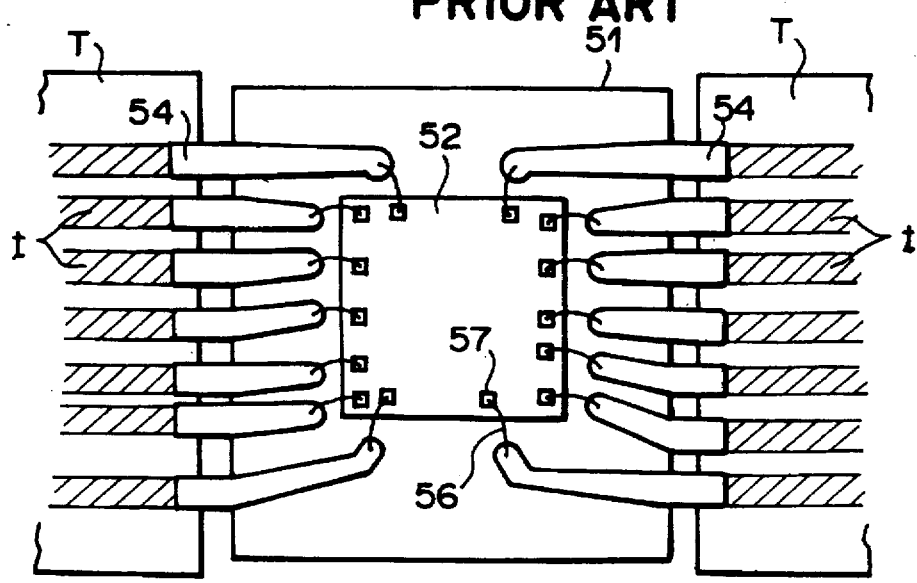
FIG. 2 is a schematic view in accordance with an inspection method for a semiconductor device.
Figure 3:
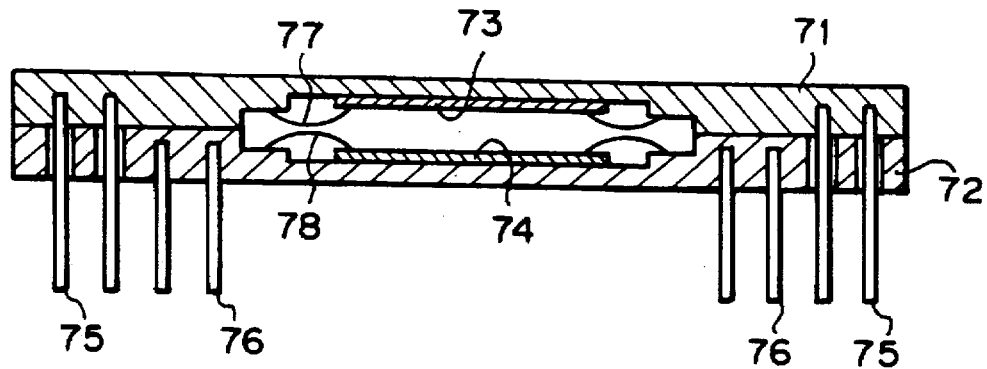
FIG. 3 is a schematic cross-sectional view showing an example of a conventional pin grid array type composite semiconductor device.

After the configuration shown in FIGS. 4 and 5 is completed, the inspection step is carried out. The inspection step can be easily carried out in the same manner as explained in the above with reference to FIG. 2 by using the method which has been established for each semiconductor chip 12, 13, in which step terminals of the inspection apparatus $T_1$ are connected to the outer portion of the leads 14 and 14' and terminals of the inspection apparatus $T_2$ are connected to the outer portion of the leads 15 and 15'. That is, the input/output can be tested for all the electrode pads 17 of the semiconductor chip 12 as well as for all the electrode pads 19 of the semiconductor chip 13. The design of a new inspection method or system or program is not required.

When both the semiconductor chips 12 and 13 are proved to have good quality in the above inspection step, the following step will be carried out.

Figure 6:
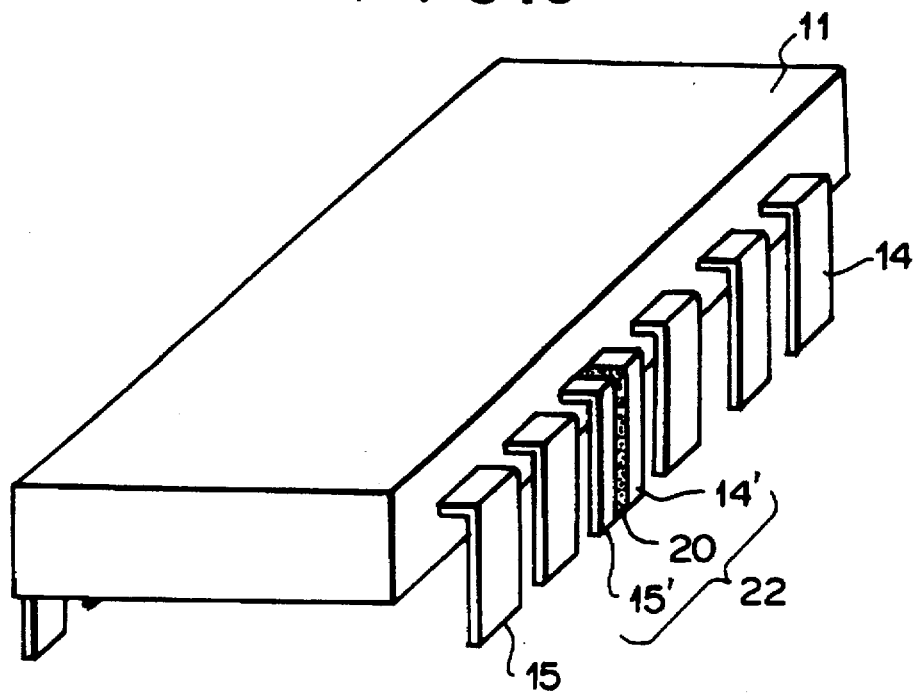
Figure 7A:
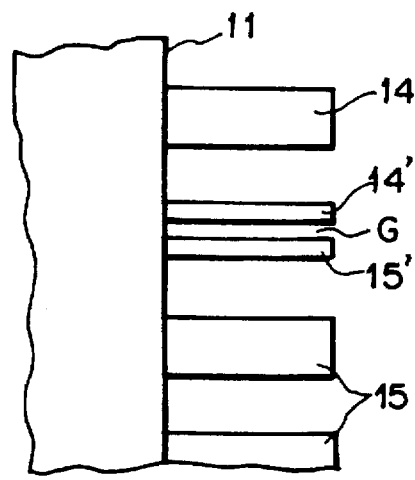
Figure 7B:
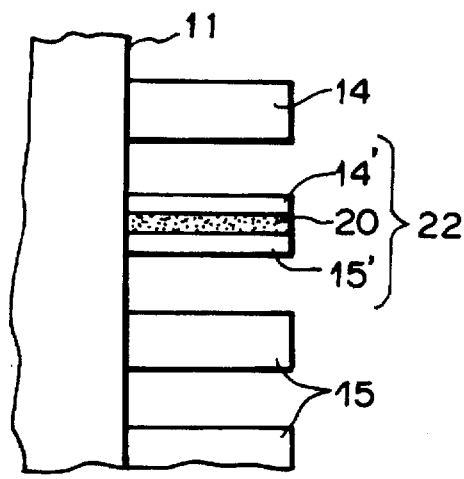

Then, as shown in FIG. 6, the gap between the outer portions of the adjacent leads 14', 15' is filled with a solder 20 to electrically connect or short-circuit the leads 14' and 15' to form a composite lead 22. FIGS. 7A and 7B show the configurations of the leads prior to and after the formation of the composite lead 22, respectively. G denotes the gap between the leads 14' and 15'.

Thus the composite semiconductor device is obtained, in which two electrode pads 17 of the semiconductor chip 12 and the corresponding two electrode pads 19 of the semiconductor chip 13 are interconnected via the composite leads 22. When the composite semiconductor device is mounted on a printed circuit board, it is unnecessary to form a wiring pattern on the circuit board for realizing an electrical connection between the two electrode pads 17 of the semiconductor chip 12 and the two electrode pads 19 of the semiconductor chip 13 and therefore, the wiring pattern of the circuit board is made simple.

Figure 8:
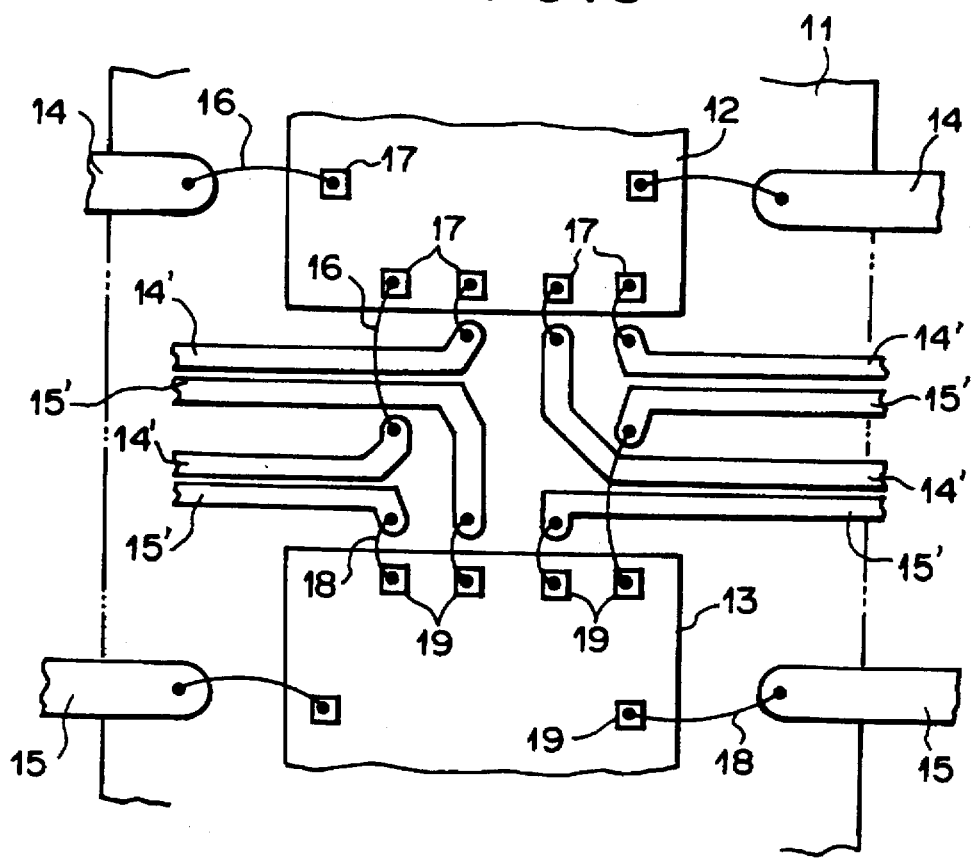
FIG. 8 is a schematic view illustrating a second embodiment of a process for manufacturing a composite semiconductor device according to the present invention.

FIG. 8 is a schematic view illustrating a second embodiment of the process for manufacturing the composite semiconductor device according to the present invention. In FIG. 8, reference numerals 11, 12, 13, 14, 14', 15, 15', 16, 17, 18 and 19 denote substantially the same members as those described in FIGS. 4, 5, 6, 7A and 7B.

In the second embodiment, four electrode pads 17 of the semiconductor chip 12 and the corresponding four electrode pads 19 of the semiconductor chip 13 are interconnected via composite leads (not shown). FIG. 8 shows a configuration prior to the formation of the composite lead, which is formed in the same manner as the first embodiment.

Although, in the above embodiments, the process for manufacturing a composite semiconductor device having two semiconductor chips is explained, it should be noted that a composite semiconductor device having three or more semiconductor chips also can be mmanufactured by forming composite leads between adjacent semiconductor chips.

Also it should be noted that the number of composite leads or signal line which connects directly the electrode pads of the adjacent semiconductor chips may be other than the 2 and 4 which are of the above embodiments.

What is claimed is:

1. A process for manufacturing a composite semiconductor device having a plurality of semiconductor chips, a package receiving said semiconductor chips and a plurality of leads, each of said leads comprising an inner portion positioned within said package and an outer portion extending outside said package, each of said semiconductor chips having an upper surface on which a plurality of electrodes are formed, the process comprising:

a first step of arranging said plurality of semiconductor chips horizontally and arranging said leads for each of said semiconductor chips such that a gap is formed between a lead of a first of said semiconductor chips and a lead of a second of said semiconductor chips;

a second step of electrically connecting each of said electrodes to an inner portion of each of said leads;

a third step of packaging said semiconductor chips and said inner portions of said leads within said package; and a fourth step of filling said gap with an electrically conductive member to form a composite lead which comprises said lead of said first semiconductor chip, said lead of said second semiconductor chip and said electrically conductive member.

2. A process for manufacturing a composite semiconductor device as set forth in claim 1, further comprising an inspection step for determining the quality of each of said semiconductor chips by conducting an input/output test using outer portions of said leads for each of said semiconductor chips after said third step and prior to said fourth step.

3. A process for manufacturing a composite semiconductor device as set forth in claim 2, wherein said fourth step is carried out if all of said semiconductor chips are determined to have a good quality in said inspection step.

4. A process for manufacturing a composite semiconductor device as set forth in claim 1, wherein said package is made of plastic material.

5. A process for manufacturing a composite semiconductor device as set forth in claim 1, wherein said electrically conductive member is made of solder.

6. A process for manufacturing a composite semiconductor device as set forth in claim 1, wherein said lead of said first semiconductor chip and said lead of said second semiconductor chip which define said gap extend adjacently in parallel to each other outside said package.

* * * * *

UNITED STATES PATENT AND TRADEMARK OFFICE
CERTIFICATE OF CORRECTION

PATENT NO.   :   5,691,243
DATED        :   November 25, 1997
INVENTOR(S)  :   Kazunori KISHIMOTO It is certified that error appears in the above-identified patent and that said Letters Patent is hereby corrected as shown below:

Column 1, item [30], Foreign Application Priority Data; "May 15, 1996" should read --May 15, 1995--.

Signed and Sealed this

Second Day of June, 1998

Attest:

BRUCE LEHMAN

*Attesting Officer*      *Commissioner of Patents and Trademarks*